US006927387B2

(12) United States Patent
Viktorovitch et al.

(10) Patent No.: US 6,927,387 B2
(45) Date of Patent: Aug. 9, 2005

(54) OPTOELECTRONIC DEVICE WITH INTEGRATED WAVELENGTH FILTERING

(75) Inventors: Pierre Viktorovitch, Tassin (FR); Michel Garrigues, La Tour de Salvagny (FR); Jean-Louis Leclercq, Morance (FR)

(73) Assignees: Centre National de la Recherche Scientifique, Paris (FR); Ecole Centrale de Lyon, Ecully (FR)

( * ) Notice: Subject to any disclaimer, the term of this patent is extended or adjusted under 35 U.S.C. 154(b) by 264 days.

(21) Appl. No.: 10/328,166

(22) Filed: Dec. 26, 2002

(65) Prior Publication Data

US 2004/0188599 A1 Sep. 30, 2004

Related U.S. Application Data

(63) Continuation of application No. PCT/FR01/02046, filed on Jun. 27, 2002.

(30) Foreign Application Priority Data

Jun. 29, 2000 (FR) .............................................. 00 08434

(51) Int. Cl.$^7$ .............................................. H01J 40/14
(52) U.S. Cl. ..................... 250/226; 250/214.1; 359/584; 359/589
(58) Field of Search .............................. 250/226, 214.1, 250/216, 237 G, 214 R, 227.28; 359/337.2, 337.21, 557, 584, 589

(56) References Cited

U.S. PATENT DOCUMENTS 5,068,528 A * 11/1991 Miller et al. ........... 250/231.13

* cited by examiner

Primary Examiner—Thanh X. Luu
Assistant Examiner—Stephen Yam
(74) Attorney, Agent, or Firm—Birch, Stewart, Kolasch & Birch, LLP

(57) ABSTRACT

The invention relates to an optoelectronic device including filter means (3) for transmitting a selected spectral portion of light waves and for reflecting a complementary spectral portion thereof, placed between means (4) for reflecting the chosen spectral portion towards the filter means and converter means (1) for transmitting the light waves to be filtered to the filter means. The converter means are at a first distance (d1) from the filter means chosen so that the waves that they transmit to them and the reflected complementary spectral portion create a first standing wave whose associated electric field has a node in the converter means (1) and at a second distance (d2) from the chosen reflector means so that the chosen spectral portion and the chosen and reflected spectral portion create a second standing wave whose associated electric field has an antinode in the converter means.

26 Claims, 2 Drawing Sheets

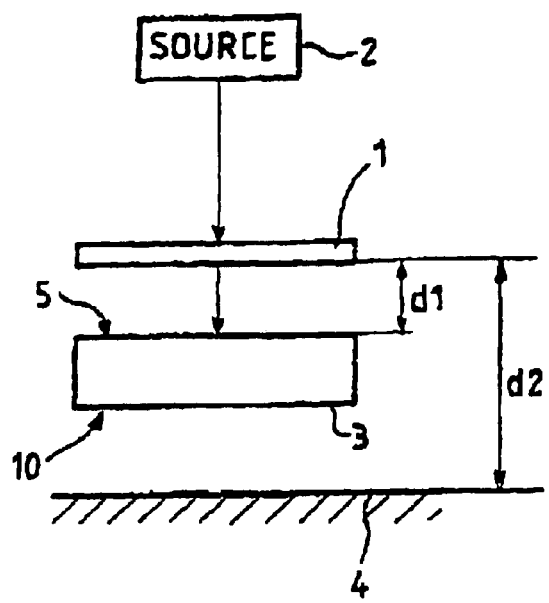
FIG_1
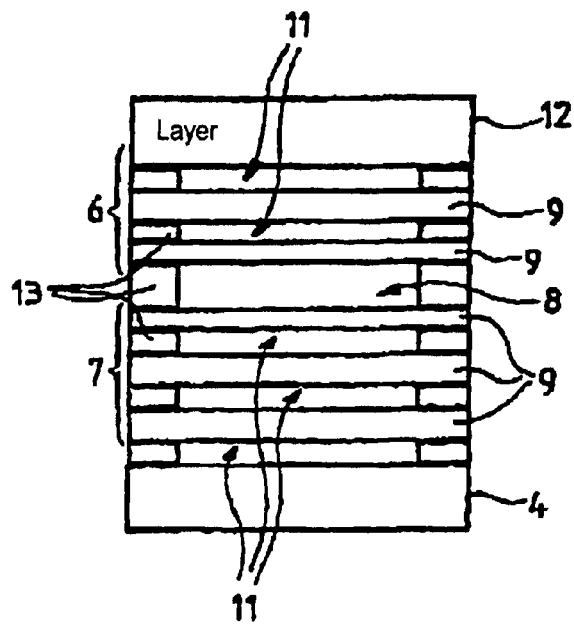
FIG_2
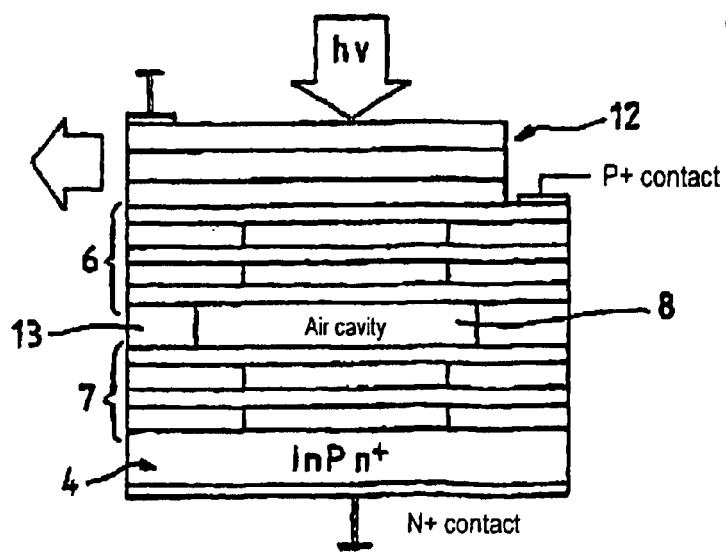
FIG_3

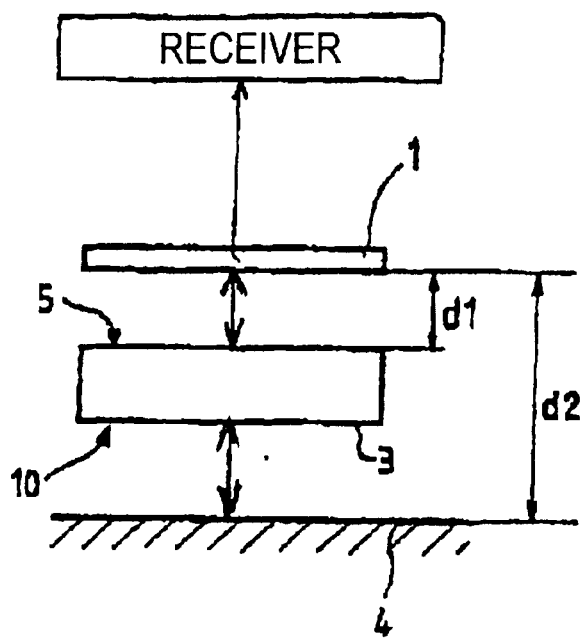
FIG_4

OPTOELECTRONIC DEVICE WITH INTEGRATED WAVELENGTH FILTERING

This is a continuation of application Ser. No. PCT/FR01/02046, filed Jun. 27, 2002.

The invention relates to optoelectronic devices that combine a transmit or receive conversion function with a function of subjecting transmitted or received light waves to wavelength filtering.

By "conversion" is meant not only photoelectric transformation, whether on transmission or on reception, but also geometrical transformation to modify some characteristics of a light wave by diffraction, for spatial control thereof.

Devices of the above type are routinely used for wavelength selective photodetection in particular. They usually include filter means, such as a Fabry-Pérot resonant optical cavity, associated with receiver means, such as a photodetector.

In a first prior art selective photodetector, the filter means receive the incident light wave, transmit to the receiver means the portion of the incident light wave that has a wavelength centered on a chosen value, and reject the complementary portion of the incident light wave. In other words, the optical filter is between the light source and the converter means (for example the detector).

The same prior art principle is applied to producing sources emitting a controlled spectrum of wavelengths. In a source of that kind, the filter means receive the light wave emitted by a photoelectric emitter (for example a light-emitting diode), transmit a wavelength centered on a chosen value, and reject the complementary portion of the light wave. The filter is therefore placed on the path between the light emitting means and the system that utilizes the filtered light wave.

In that optoelectronic device, it is extremely difficult, if not impossible, to use a monolithic technology employing fabrication processes that can be conducted successively and independently. Thus in practice a hybrid technology has to be used for transferring the filter to the converter (photodetector or light emitter, for example), which causes serious problems, which are further accentuated if the filter is a micro-opto-electro-mechanical (MOEM) filter.

In a second prior art device, applied to detection and transmission, the photodetector or the light emitter is inserted into a cavity in the filter means. That produces a resonant cavity enhanced photodetector or a resonant cavity light emitting diode.

With that device, transferring a top Bragg mirror on top of the photodetector or the emitter causes problems similar to those previously described.

Moreover, regardless of which device is used, technological limitations increase as the requirements in terms of the performance of the device increase. It is therefore virtually impossible to use those devices in some fields, such as wavelength division multiplexing in optical telecommunications.

An object of the invention is to remedy all or some of the above-mentioned drawbacks.

To this end the invention proposes an optoelectronic device including light energy converter means adapted to transmit light waves to be processed to filter means adapted to transmit a chosen spectral portion of the incident light waves and to reflect towards said converter means a complementary spectral portion of said waves and reflector means adapted to reflect the chosen spectral portion transmitted by the filter means towards said filter means, which device is characterized in that the filter means are between the converter means and the reflector means. Accordingly, in the device of the invention, the filter means are, so to speak, outside the usual path taken by light waves received or transmitted by the converter means when those waves return to the device (photodetector or other device) that is to use them after they have been filtered. In other words, the filter means are no longer between the source of light waves to be filtered and the device using the filtered waves.

According to another feature of the invention, the converter means are at a first distance from the filter means chosen so that the waves that they transmit and the complementary spectral portion reflected by the filter means create a first standing wave whose associated electric field has a node in the converter means and at a second distance from the reflector means chosen so that the chosen spectral portion and the chosen spectral portion reflected by the reflector means create a second standing wave whose associated electrical field has an antinode in the converter means.

If the electric field associated with a standing wave has a node in the converter means, there is no or virtually no interaction between the standing wave and the converter means. Otherwise, if the electric field associated with a standing wave has an antinode in the converter means, there is maximum interaction between the standing wave and the converter means.

Thus choosing the first and second distances in the converter means modulates the value of the electric field resulting from the propagation of the light wave within the device as a function of the wavelength. To be able to modulate their response, it is therefore sufficient for the converter means to be sensitive to the electric field. This is the case in particular if the device operates as a receiver and the converter means take the form of a photodetector whose absorption is proportional to the square of the electric field. By reciprocity, it is also the case for a device functioning as an emitter, i.e. for a photoemitter.

In the invention, the converter means may be produced after the reflector means and the filter means. Thus it is then possible to use a monolithic technology. For example, the device may be entirely produced from III–V semiconductor materials by an epitaxial process of the kind used to fabricate vertical cavity lasers. Micromachining techniques may also be used.

By means of the invention, it is possible to use photodetector or photoemitter converter means or converter means capable of providing spatial control of the filtered (standing) wave, for example by diffraction.

In an advantageous embodiment, the filter means take the form of a resonant cavity, for example a Fabry-Pérot cavity, between two Bragg mirrors formed of alternating layers of a material with a high refractive index and a material with a low refractive index.

For example, the high and low refractive index layers are respectively layers of silicon (Si) and silica ($SiO_2$) and the cavity consists of silica ($SiO_2$).

In a particularly advantageous variant, the high refractive index layers are layers of a semiconductor material, the low refractive index layers are layers of air, and said cavity is a layer of air. In this case, it is advantageous if the first Bragg mirror includes semiconductor layers with the same P or N type doping, the second Bragg mirror includes semiconductor layers having the opposite N or P type doping, and the layers are separated by I-type spacers (i.e. spacers that are not intentionally doped) to define a PIN or NIP structure and are adapted to have respective chosen electrical potentials applied to them. Varying the biasing moves at least one doped semiconductor layer relative to the oppositely-doped layers, and thus modulates the filter wavelength of the filter means.

Of course, the doping, the composition, and the thickness both of the layers and of the spacers are chosen so that the structure has an optical transfer function adapted to wavelength filtering.

A semi-reflecting layer can be provided on the upstream side of the converter means to reinforce the interaction between the filtered standing wave and the converter means.

The invention also relates to some uses of the device defined hereinabove, especially in the fields of optical switching of light beams, spatial scanning of light beams, color matrix displays, and wavelength division multiplexing.

Other features and advantages of the invention will become apparent on examining the following detailed description and the accompanying drawings, in which:

FIG. 1 is a highly diagrammatic view in section of a device of the invention constituting a photodetector, FIG. 2 is a view in cross-section of a device of the invention constituting a wavelength-selective photodetector, FIG. 3 is a view in cross-section of another device of the invention constituting a tunable and wavelength selective photodetector, and FIG. 4 is a highly diagrammatic view in section of a device of the invention constituting a photoemitter.

The accompanying drawings are essentially definitive. Consequently, they can serve not only to fill in the details of invention but also to contribute to defining it, where applicable.

The essential components of a device of the invention constituting a photodetector are described first with reference to FIG. 1.

The device includes first converter means 1 receiving incident light waves from a light wave source 2 and transmitting light waves to filter means 3.

The filter means 3 select a portion of the incident waves that has a wavelength centered on a chosen wavelength $\lambda_c$. To be more precise, the filter means select the wavelengths in a range $\Delta\lambda$ whose center wavelength is $\lambda_c$. The range therefore extends substantially from the value $\lambda_c-\Delta\lambda/2$ to the value $\lambda_c+\Delta\lambda/2$. Here selecting wavelengths in the range $\Delta\lambda$ means allowing to pass (or transmitting) only wavelengths only light waves whose wavelength were in one or more chosen ranges (thereby constituting a band-pass filter, a high-pass filter or a low-pass filter).

The device of the invention further includes reflector means 4 downstream of the filter means 3 to reflect the filtered waves toward the filter means 3, which transmit the filtered and reflected waves to the converter means 1.

In the device of the invention, the converter means 1 are therefore between the light wave source 2 and the filter means 3.

According to an essential feature of the invention, the converter means 1 are at a first distance d1 from the entry face (first face) of the filter means 3 and the converter means 1 are a second distance d2 from the reflector means 4.

The first distance d1 is chosen so that the incident waves emitted by the source 2 and the waves reflected by the entry face 5, because its wavelength is not in the range $\Delta\lambda$, create a first standing wave whose associated electric field has a node inside the converter means 1, to be more precise in its active portion. It is clear that, for this condition to be satisfied, the thickness of the active portion of the converter means 1 must be very small compared to the wavelength $\lambda_c$ so that the electric field cannot have a plurality of values significantly different the value at its node. The maximum equivalent optical thickness of the active portion of the converter means 1 is typically of the order of $0.1\lambda_c$.

If this first condition is satisfied, the wave reflected by the entry face 5 of the filter means 3 does not interact much or at all with the active portion and is therefore not processed. For example, if the active layer is an absorbent layer adapted to detect waves of wavelength $\lambda_c$, the absorption is at a minimum if the value of the electric field associated with the first standing wave is substantially equal to its value at the node.

For a reflection phase angle substantially equal to 180° at the entry face 5 of the filter means 3, the first condition is satisfied if the first distance d1 is equal to $k\lambda_c/2$, where k is a positive integer or zero.

When the first distance d1 has been fixed, the second distance d2 is determined. To this end, the distance between the reflector means 4 and the active portion of the converter means 1 is determined that is required for a second standing wave to be created by interaction between the waves transmitted and filtered by the filter means 3 and the waves transmitted, filtered and reflected by the filter means 3 and the reflector means 4 and for the electric field associated with the second standing wave to have an antinode inside the conversion means 1.

Under these conditions, the interaction between the active portion of the converter means 1 and the second standing wave is at a maximum. Consequently, if the two conditions relating to the distances d1 and d2 are satisfied, the converter means 1 are sensitive only to waves whose wavelength is in the range $\Delta\lambda$ (i.e. in the transmission band of the filter means 3).

A wavelength selective converter is thus obtained in which the conversion portion is on the optical path of the incident wave, ahead of the filter means, and not within or after the filter means. This simplifies the fabrication of the device from the technological point of view.

A device of the above kind can be used in many fields, depending on the type of conversion that it performs. Thus the converter means 1 can be detector means including a thin active absorption layer, typically with an optical thickness less than approximately $0.1\lambda_c$ (i.e. small in comparison to the wavelength of the second standing wave). As an alternative to this, detection can be effected with the aid of a multilayer multiple quantum well structure with the layers separated from each other by a distance $k\lambda_c/2$ (where k is a positive integer or zero) to follow the periodicity of the first and second standing waves. For example, the thin absorption layer(s) are produced using a conventional deposition process such as those used in silicon microelectronics, the thin absorption layer being of the bolometric or photoconductive type.

The active portion of the converter means 1 can be an emitter portion, for example a portion that electroluminesces, photoluminesces, or fluoresces due to the action of an electric current applied via electrodes formed on the device. In this case, the device can form part of active colored source matrices for color displays. To fabricate a color display screen, for example, a matrix of dielectric filters can first be produced on a bottom mirror resting on a large substrate. Then electroluminescent sources are produced that no longer have to withstand the technology steps (and in particular the heating) necessary for fabricating the filters. This is particularly advantageous in the case of organic light emitting diodes (OLED), which include organic luminescent emitter materials with a wide spectral band unable to withstand aggressive heat treatment.

However, the converter means could be used for spatial control of filtered waves. This could refer, for example, to diffraction means such as a diffraction grating for selecting a privileged direction of the filtered waves as a function of the value of the associated electromagnetic field. This can be particularly beneficial in the field of switching light beams and especially so in the field of spatial scanning light beams.

The selective filter means preferably take the form of a Fabry-Pérot resonant cavity including two Bragg mirrors separated by a resonant cavity. Each Bragg mirror can consist of three quarter-wave layers of silicon (Si) separated by two quarter-wave layers of silica ($SiO_2$), with the resonant cavity consisting of silica ($SiO_2$). This embodiment can transmit (or filter) wavelengths of 1550 manometers.

A Fabry-Pérot filter of the above type can be combined with reflector means 4 such as a mirror produced by a 200 manometers thick layer of aluminum, for example.

In this silicon technology embodiment, the first distance d1 is obtained by interleaving a $0.475\lambda_c$ thick layer between the entry face 5 of the filter 3 and the active layer, for example an absorption layer with an optical thickness of $0.05\lambda_c$ whose free-field intrinsic absorption is approximately 3% at 1550 manometers. The second distance d2 is obtained by interleaving between the aluminum mirror 4 and the exit face 10 of the filter 3 (i.e. its face opposite the entry face 5) a layer of silica ($SiO_2$) with an optical thickness of $0.694\lambda_c$.

An alternative to the above which is particularly beneficial from the technology point of view consists of integrating the reflector means 4 into the second Bragg mirror of the Fabry-Pérot filter 3, i.e. reinforcing the reflectivity of the second Bragg mirror by increasing the number of quarter-wave alternations. For example, the aluminum layer providing the mirror 4 can be replaced by one or preferably two alternations supplementary to the three original alternations, without this modifying the performance of the device.

It is important to note that, because the filtered light wave passes through the filter twice in opposite directions, the half-amplitude value of the pass-band of the absorption (conversion) curve is substantially half the width of that of the filter alone. As a result of this, with a smaller number of alternations for each Bragg mirror of the filter 3 the device of the invention can achieve selectivity performance equivalent to that of prior art devices.

Generally speaking, the interaction between the second standing wave and the active layer of the converter means 1 can be significantly improved if a partial (semi-reflecting) reflector is added on the upstream side of the converter means, for example ahead of the active conversion layer. This increases the amplitude of the standing wave in the active layer and reduces the pass-band, combined with increased rejection of reflected light waves outside the pass-band.

For example, in the case of an active absorption layer, a partial reflector achieves an increase of the maximum absorption from 30% to 80%, approximately, with a reduction of approximately 0.5 nanometer in the half-amplitude width of the absorption curve.

Other combinations of dielectric materials, reflecting materials and active materials can be envisaged, depending on the target spectral range. The choice of the materials and the thicknesses of the layers appropriate to the various applications of the invention can readily be determined by the person skilled in the art once the object of the invention is known.

This silicon technology embodiment can be envisaged, for example, for producing photodetector matrices that are selective at diverse fixed wavelengths. A multilayer structure based on silicon/silica materials is produced on a silicon substrate using a plasma CVD process. The monocrystalline semiconductor layers for producing the photodiodes are then transferred to the microcavity using a molecular bonding method well-known to the person skilled in the art. The converter diodes are then produced by conventional techniques, for example those used to fabricate vertical cavity lasers.

A different embodiment of the filter means 3 which can be implemented monolithically is described next with reference to FIG. 2. Also, as explained below, this embodiment can produce devices that are not only wavelength selective but also electrically tunable.

Here, wavelength selectivity and tunability are obtained with a micro-opto-electro-mechanical (MOEM) structure. These structures can be produced from semiconductor materials, for example III-V semiconductor materials. Of course, other types of materials can be envisaged, for example conventional thin layers.

The structures include a vertical microcavity which is micromachined using a surface micromachining technique and is mechanically deformable by varying electric potentials applied to some of its semiconductor layers. To be precise, the structure is a vertical Fabry-Pérot optical resonator including an optical cavity consisting of a layer of air and delimited vertically by two Bragg mirrors 6 and 7. The Bragg mirrors (reflectors) 6, 7 are formed by alternating quarter-wave layers of air and semiconductor, for example gallium arsenide (GaAs) or indium phosphide (InP). However, these layers can equally well be InGaAs/InP or InAlAs/InGaAlAs heterostructures deposited on an InP substrate, AlAs/GaAs heterostructures deposited on a GaAs substrate or InGaP/GaAs heterostructures deposited on a GaAs substrate.

The above materials are merely preferred examples, of course.

In the example shown in FIG. 2, the semiconductor layers 9 are spaced from each other by spacers 13 also made from semiconductor materials and defining housings filled with air. The layers 9 define blades that can be deformed (curved) by electrostatic stresses and which consequently can deform the optical cavity 8 filled with air, which modifies the spectral response of the device and confers on it its wavelength tunability.

This deformation of the blades can only be obtained with particular forms of doping of the layers of the two Bragg mirrors 6, 7, however. This is because the deformation can be obtained only in the presence of at least one PIN substructure, in particular to delimit the resonant cavity 8.

For example, the semiconductor layers 9 of the first Bragg mirror 6 are intentionally N-type doped or P-type doped and the semiconductor layers 9, 12 of the second Bragg mirror 7 are intentionally P-type doped or N-type doped, and the spacers 13 that delimit the resonant cavity are of the I type (i.e. they are not intentionally doped), so as to define a PIN or NIP structure to the layers of which respective chosen electric potentials are applied. The other spacers, which separate the layers of the same Bragg mirror, are either intentionally doped with the same type of doping as the layers concerned or not intentionally doped (I-type). In the embodiment described above the structure is a PPPINNN or NNNIPPP structure.

Reverse biasing the PIN substructure produces electrostatically controlled vertical movement of one or more blades. To be more precise, due to the effect of the biasing, the electric field that is established between the two adjacent blades that delimit the resonant cavity 8 induces an electrostatic force that moves the two blades toward each other, thereby reducing the resonant wavelength $\lambda_c$ of the cavity.

The filter wavelength of the filter means can be modulated by moving one or more of the N or P doped semiconductor layers relative to the oppositely P or N doped layers by varying their respective biases.

More complex modulations of the transfer function of the device can be obtained by intentionally inserting other blades to constitute other PIN substructures, with the orientation chosen by independent doping of each of the suspended blades. The substructures must be reverse-biased for their suspended blades to be subjected to the electric field intended to move them.

Thus the structure could be a PINIPIN, PPPINIPPP or NNNIPINIPPP structure, for example.

Each PIN or NIP substructure constitutes a PIN junction well-known to the person skilled in the art.

The voltages are applied to the semiconductor layers via ohmic contacts, preferably made of AuGe, Pd—AuGe or Ti—Pt—Au alloys. The contacts are formed on the two outside layers of the structure, or on each semiconductor layer of the structure, or on the two outside layers and some of the intermediate layers.

Given the great difference between the refractive index of air (n=1, low index) and that of the semiconductor constituting the blades (n=3.2, high index), a small number of alternations is sufficient to produce the optical filtering that provides the wavelength selectivity ($\lambda_c$).

In the example shown in FIG. 2, the active layer (for example an absorption layer) is on the upstream side of ("on top of") the optical resonator and is included in the high-index layer 12 of the first alternation of the first Bragg mirror 6, of course, the active conversion layer 1 could be on the upstream side of the first alternation, in which case the layers of the first Bragg mirror 6 would all be the same thickness.

FIG. 3 shows in detail the integration of the active conversion layer in the first Bragg mirror. In this example, the active layer is a photodiode taking the form of a multiple quantum well structure in which each multiple well constitutes an absorbant layer. A structure of this kind with multiple quantum wells is produced before the step of micromachining the heterostructure on top of which it is situated and which yields the multiblade structure forming the filter 3.

Likewise, and as previously indicated, the reflector means 4 can be integrated into the last semiconductor layer of the second Bragg mirror 7 of the Fabry-Pérot filter 3. In fact, reflection is achieved by increasing the reflectivity of the second Bragg mirror by increasing the number of quarter-wave alternations. For example, the layer of aluminum providing the mirror 4 can be replaced by two alternations additional to the original three alternations, without this modifying the performance of the device.

Thanks to the invention, it is therefore possible to produce a device entirely by epitaxial growth of III–V semiconductor materials or by an epitaxial process combined with one or more selective chemical etching techniques. Different epitaxial techniques can be envisaged, provided that they allow suitable control of the layer thickness. Molecular beam epitaxy (MBE) may be cited, for example, or low-pressure metallo-organic chemical vapor phase deposition (LP-MOCVD) or chemical beam epitaxy (CBE).

These techniques offer extremely precise control of thickness and ensure excellent crystal quality and very steep interfaces. Moreover, they offer very accurate control of composition and doping. Finally, they provide excellent control over residual mechanical stresses.

There are many chemical etching techniques, especially wet etching techniques, that can be used for the selective micromachining of the suspended portions (blades). The following wet etching techniques may be cited by way of example: using $FeCl_3:H_2O$ or $HF:H_2O_2:H_2O$ for the InGaAs/InP system, using $HCl:H_2O$ or $HCl:H_3PO_4$ for the InAlAs/InGaAlAs and GaInP/GaAs systems, and using HF for the AlAs/GaAs system.

Of course, these are merely examples of growth and etching techniques.

The device of the invention offers an undeniable technological-advantage in that it enables the use of a monolithic technology employing proven processes that can be conducted successively and independently. It satisfies the specifications for wavelength division multiplexing used in the field of optical telecommunications, in particular in terms of selectivity, tuning range and electrical bandwidth. For example, it is now possible to achieve a bandwidth of the order of 2.5 GHz.

The devices can be used in other technical fields, in particular for industrial control (for example in the agriculture/foodstuffs industry), for microspectrometry, in particular in the field of the environment (detection of transmission or absorption of gases), for some medical analyses using spectroscopic techniques, for displays using color matrix screens, and more generally in all fields necessitating optical processing of light signals.

The invention is not limited to the embodiments described above by way of example only and encompasses all variants within the scope of the following claims that may suggest themselves to the person skilled in the art.

Accordingly, the device can include on the upstream side of the converter means a semi-reflecting layer to strengthen the interaction between the filtered standing wave and the converter means.

A photoemitter according to the invention is shown diagrammatically in FIG. 4, has substantially the same structure as the photoreceiver in FIG. 1, and operates in accordance with the same principle, except that a receiver 14 replaces the light source 2 in FIG. 1.

What is claimed is:

1. An optoelectronic device including light energy converter means (1) adapted to transmit light waves to be processed to filter means (3) adapted to transmit a chosen spectral portion of the incident light waves and to reflect towards said converter means (1) a complementary spectral portion of said waves and reflector means (4) adapted to reflect the chosen spectral portion transmitted by the filter means towards said filter means (3), which device is characterized in that the filter means (3) are between the converter means (1) and the reflector means (4);

wherein said converter means (1) are at a first distance (d1) from the filter means (3) chosen so that the waves that they transmit and the complementary spectral portion reflected by said filter means (3) create a first standing wave whose associated electric field has a node in said converter means (1) and at a second distance (d2) from the reflector means (4) chosen so that the chosen spectral portion and the chosen spectral portion reflected by said reflector means (4) create a second standing wave whose associated electrical field has an antinode in said converter means.

2. A device according claim 1, characterized in that said converter means (1) are adapted to receive light waves to be filtered from an external light wave source and to detect the second standing wave by absorption.

3. A device according to claim 2, characterized in that said converter means (1) include an absorption layer.

4. A device according to claim 2, characterized in that said converter means (1) include a multiplicity of absorption layers spaced from each other at a distance substantially equal to an integer number of times half the wavelength of the chosen spectral portion.

5. A device according to claim 2, characterize in that the absorption layer is of the bolometric or photoconductive type.

6. A device according to claim 1, characterized in that said converter means (1) include a photodiode having an active layer that is thin compared to the wavelength of the second standing wave.

7. A device according to claim 1, characterized in that said converter means (1) include a multiple quantum well photodiode.

8. A device according to claim 1, characterized in that said converter means (1) are adapted to emit photons forming said light waves to be filtered by said filter means (3).

9. A device according to claim 8, characterized in that said converter means (1) are adapted to emit light by a mechanism chosen from the group comprising photoluminescence, electroluminescence and fluorescence.

10. A device according to claim 1, characterized in that said converter means (1) are adapted to control the second standing wave spatially.

11. A device according to claim 10, characterized in that said converter means (1) include a diffraction grating.

12. A device according to claim 1, characterized in that the filter means (3) include a resonant cavity structure (8) interleaved between two Bragg mirrors formed of alternating high refractive index and low refractive index layers.

13. A device according to claim 12, characterized in that the high refractive index layers are layers of silicon (Si), the low refractive index layers are layers of silica (SiO2) and said cavity consists of silica (SiO2).

14. A device according to claim 12, characterized in that the high refractive index layers are layers of a semiconductor material, the low refractive index layers are layers of air, and said cavity is a layer of air.

15. A device according to claim 14, characterized in that the first Bragg mirror (6) includes semiconductor layers (9) with the same P or N type doping, the second Bragg mirror (7) includes semiconductor layers (9) with the same opposite N or P type doping, and the layers (9) are separated by spacers (13) that are not intentionally doped (I-type) to define a PIN or NIP structure, and are adapted to have respective chosen electrical potentials applied to them.

16. A device according to claim 15, characterized in that the filter wavelength of the filter means can be modulated by moving one or more of the N or P doped semiconductor layers relative to the opposite P or N doped layers by varying their respective biasing.

17. A device according to 12, characterized in that the second Bragg mirror (7) includes one or more additional alternations defining the reflector means (4).

18. A device according to claim 1, characterized in that it includes a semi-reflecting layer on the upstream side of the converter means (1).

19. A device according to claim 1, characterized in that the filter means are adapted to transmit light waves whose wavelength is centered on a chosen value.

20. A device according to claim 1, characterized in that the filter means are adapted to stop light waves whose wavelength is in one or more chosen ranges.

21. A device according to claim 8, wherein said converter means are between a receiver and the filter means.

22. A method, comprising the steps of:
utilizing a light energy converter for light waves;
transmitting the light waves from the converter to a filter;
transmitting from the filter a chosen spectral portion of the incident light waves and reflecting towards the light energy converter a complementary spectral portion of said waves;
reflecting with a reflector the chosen spectral portion, transmitted from the filter, back towards the filter; and
locating the filter between the converter and the reflector;
wherein the converter is located at a first distance (d1) from the filter chosen so that the transmitted waves and the complementary spectral portion reflected by the filter create a first standing wave whose associated electric field has a node in the converter; and
wherein the converter is located at a second distance (d2) from the reflector chosen so that the chosen spectral portion and the chosen spectral portion reflected by the reflector create a second standing wave whose associated electrical field has an antinode in the converter.

23. A method according to claim 22 wherein the light energy converter for light waves is used to spatially scan light beams.

24. A method according to claim 22 wherein the light energy converter for light waves is used for wavelength division multiplexing.

25. A method according to claim 22 wherein the the light energy converter for light is used to display an image on a color matrix display.

26. A method according to claim 22 wherein the light energy converter for light waves is used for optically switching light beams.

* * * * *

UNITED STATES PATENT AND TRADEMARK OFFICE
CERTIFICATE OF CORRECTION

PATENT NO. : 6,927,387 B2
DATED : August 9, 2005
INVENTOR(S) : Pierre Viktorovitch et al.

It is certified that error appears in the above-identified patent and that said Letters Patent is hereby corrected as shown below:

<u>Title page,</u>
Item [63], Related U.S. Application Data, should read:
-- [63] Continuation of application No. PCT/FR01/02046, filed on Jun. 27, 2001. --.

<u>Column 1,</u>
Line 5, change "Jun. 27, 2002" to -- Jun. 27, 2001 --.

Signed and Sealed this

Second Day of May, 2006

JON W. DUDAS
*Director of the United States Patent and Trademark Office*